(12) United States Patent
Williamson, III et al.

(10) Patent No.: US 6,632,029 B1
(45) Date of Patent: **\*Oct. 14, 2003**

(54) METHOD & APPARATUS FOR PACKAGING HIGH FREQUENCY COMPONENTS

(75) Inventors: Robert S. Williamson, III, Madison, WI (US); Robert A. Marsland, Madison, WI (US)

(73) Assignee: New Focus, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/552,893

(22) Filed: Apr. 20, 2000

Related U.S. Application Data

(60) Provisional application No. 60/171,933, filed on Dec. 22, 1999, provisional application No. 60/171,927, filed on Dec. 22, 1999, and provisional application No. 60/174,038, filed on Dec. 30, 1999.

(51) Int. Cl.[7] ................................................. G02B 6/36
(52) U.S. Cl. ............................ 385/92; 385/24; 385/88; 359/154; 359/159; 250/214.1; 257/457; 257/459
(58) Field of Search ..................... 385/24, 92, 88–94; 359/124, 109, 152, 154, 159, 180, 189; 250/214.1, 227.11; 257/457, 459, 465

(56) References Cited

U.S. PATENT DOCUMENTS

| 4,030,811 A | 6/1977 | Khoe et al. | |
| 4,119,363 A | 10/1978 | Camlibel et al. | 385/88 |
| 4,130,343 A | 12/1978 | Miller et al. | |
| 4,296,998 A | 10/1981 | Dufft | |
| 4,346,294 A | 8/1982 | Albaugh et al. | 250/227 |
| 4,399,541 A | 8/1983 | Kovats et al. | 372/36 |
| 4,413,881 A | 11/1983 | Kovats | 385/88 |
| 4,479,698 A | 10/1984 | Landis et al. | |
| 4,500,165 A | 2/1985 | Scholl et al. | |
| 4,591,711 A | 5/1986 | Taumberger | |
| 4,623,220 A | 11/1986 | Grabbe et al. | |
| 4,626,884 A | 12/1986 | Shannon | 357/30 |
| 4,647,148 A | 3/1987 | Katagiri | 350/96.2 |
| 4,657,346 A | 4/1987 | Berry et al. | |
| 4,707,067 A | 11/1987 | Haberland et al. | |
| 4,708,431 A | 11/1987 | Pikulski et al. | |
| 4,720,163 A | 1/1988 | Goodwin et al. | |
| 4,722,586 A | 2/1988 | Dodson et al. | |
| 4,726,648 A | 2/1988 | Haberland et al. | |
| 4,728,787 A | 3/1988 | Henry et al. | |
| 4,747,657 A | 5/1988 | Chaoui et al. | |
| 4,752,109 A | 6/1988 | Gordon et al. | |
| 4,756,590 A | 7/1988 | Forrest et al. | |
| 4,762,386 A | 8/1988 | Gordon et al. | |
| 4,766,705 A | 8/1988 | Dholakia | |
| 4,779,947 A | 10/1988 | Ito | |
| 4,802,178 A | 1/1989 | Ury | |
| 4,834,490 A | 5/1989 | Falkenstein et al. | |
| 4,838,639 A | 6/1989 | Morankar et al. | |
| 4,844,581 A | 7/1989 | Turner | |
| 4,865,410 A | 9/1989 | Estrada et al. | |
| 4,865,417 A | 9/1989 | Naohiro et al. | |

(List continued on next page.)

Primary Examiner—Phan T. H. Palmer
(74) Attorney, Agent, or Firm—Meyertons Hood Kivlin Kowert & Goetzel, P.C.; B. Noel Kivlin

(57) ABSTRACT

The present invention provides a method and apparatus for packaging high frequency electrical and/or electro-optical components. The present invention provides a package which may be surface mounted on a board with other electrical components. The shielding provided by the package minimizes electromagnetic interference with other electrical components on the board. The package includes a controlled impedance I/O interface for coupling with the electrical and/or electro-optical component(s) in the package. The package interface may also include a differential I/O capability to further control electromagnetic fields generated at the interface. Additionally, the package may include an optical link provided by one or more optical fibers extending from the package.

26 Claims, 12 Drawing Sheets

U.S. PATENT DOCUMENTS

| | | |
|---|---|---|
| 4,867,524 A | 9/1989 | Courtney et al. |
| 4,873,566 A | 10/1989 | Hokanson et al. ............ 357/74 |
| 4,897,711 A | 1/1990 | Blonder et al. |
| 4,930,857 A | 6/1990 | Acarlar ...................... 350/96.2 |
| 4,946,246 A | 8/1990 | Shiga |
| 4,966,439 A | 10/1990 | Althaus et al. |
| 4,988,159 A | 1/1991 | Turner et al. |
| 5,011,256 A | 4/1991 | Johnson et al. |
| 5,071,215 A | 12/1991 | Hockaday |
| 5,073,002 A | 12/1991 | Hockaday |
| 5,077,819 A | 12/1991 | Greil et al. |
| 5,113,466 A | 5/1992 | Acarlar et al. |
| 5,127,073 A | 6/1992 | Mulholland et al. |
| 5,146,526 A | 9/1992 | Sweeney et al. |
| 5,155,786 A | 10/1992 | Ecker et al. |
| 5,175,410 A | 12/1992 | Freedman et al. |
| 5,177,806 A | 1/1993 | Abbott et al. |
| 5,217,906 A | 6/1993 | Abbott et al. ................... 437/8 |
| 5,218,223 A | 6/1993 | Spaeth et al. |
| 5,221,860 A | 6/1993 | Dietrich et al. ............. 257/678 |
| 5,241,614 A | 8/1993 | Ecker et al. |
| 5,276,754 A | 1/1994 | Blair et al. ................... 385/88 |
| 5,295,700 A | 3/1994 | Crews et al. |
| 5,361,317 A | 11/1994 | Hartman et al. .............. 385/43 |
| 5,376,909 A | 12/1994 | Nelson et al. .............. 333/247 |
| 5,451,769 A * | 9/1995 | Mc Adoo et al. ....... 257/457 X |
| 5,452,389 A | 9/1995 | Tonai et al. ................... 385/92 |
| 5,467,419 A | 11/1995 | Roff et al. .................... 385/92 |
| 5,509,952 A | 4/1996 | Moore et al. ................ 65/406 |
| 5,550,088 A | 8/1996 | Dautartas et al. ........... 437/225 |
| 5,557,212 A | 9/1996 | Isaac et al. |
| 5,611,014 A | 3/1997 | Basavanhally ............... 385/90 |
| 5,631,987 A | 5/1997 | Lasky et al. ................... 385/88 |
| 5,658,364 A | 8/1997 | DeVore et al. ................ 65/431 |
| 5,689,608 A | 11/1997 | Moore et al. ............... 385/139 |
| 5,692,084 A | 11/1997 | Roff ........................... 385/88 |
| 5,729,147 A | 3/1998 | Schaff |
| 5,745,311 A | 4/1998 | Fukuoka et al. |
| 5,764,832 A | 6/1998 | Tabuchi ....................... 385/49 |
| 5,764,836 A | 6/1998 | Roff ........................... 385/88 |
| 5,793,915 A | 8/1998 | Joyce |
| 5,802,228 A | 9/1998 | Bock et al. .................... 385/78 |
| 5,815,623 A | 9/1998 | Gilliland et al. .............. 385/93 |
| 5,838,703 A | 11/1998 | Lebby et al. .................. 372/43 |
| 5,841,924 A | 11/1998 | Mugiya et al. ............... 385/93 |
| 5,854,869 A | 12/1998 | Joyce |
| 5,857,047 A | 1/1999 | Strand et al. |
| 5,875,275 A | 2/1999 | Evans et al. ................... 385/88 |
| 5,881,189 A | 3/1999 | Carberry et al. |
| 5,911,021 A | 6/1999 | MacDonald et al. .......... 385/35 |
| 5,916,458 A | 6/1999 | Komoriya et al. |
| 5,930,276 A | 7/1999 | Dou et al. ..................... 372/34 |
| 5,953,355 A | 9/1999 | Kiely et al. .................... 372/43 |
| 5,963,695 A | 10/1999 | Joyce .......................... 385/88 |
| 5,971,628 A | 10/1999 | Dona et al. .................... 385/88 |
| 5,977,567 A | 11/1999 | Verdiell ...................... 257/704 |
| 6,071,017 A | 6/2000 | Gilliland et al. .............. 385/93 |
| 6,081,637 A | 6/2000 | Rekow ........................ 385/31 |
| 6,081,638 A | 6/2000 | Zhou ........................... 385/93 |
| 6,106,161 A | 8/2000 | Basavanhally et al. ........ 385/88 |
| 6,122,430 A | 9/2000 | Bookbinder et al. ........ 385/137 |
| 6,140,698 A | 10/2000 | Damphousse et al. ....... 257/704 |
| 6,164,837 A | 12/2000 | Haake et al. ................. 385/90 |

\* cited by examiner

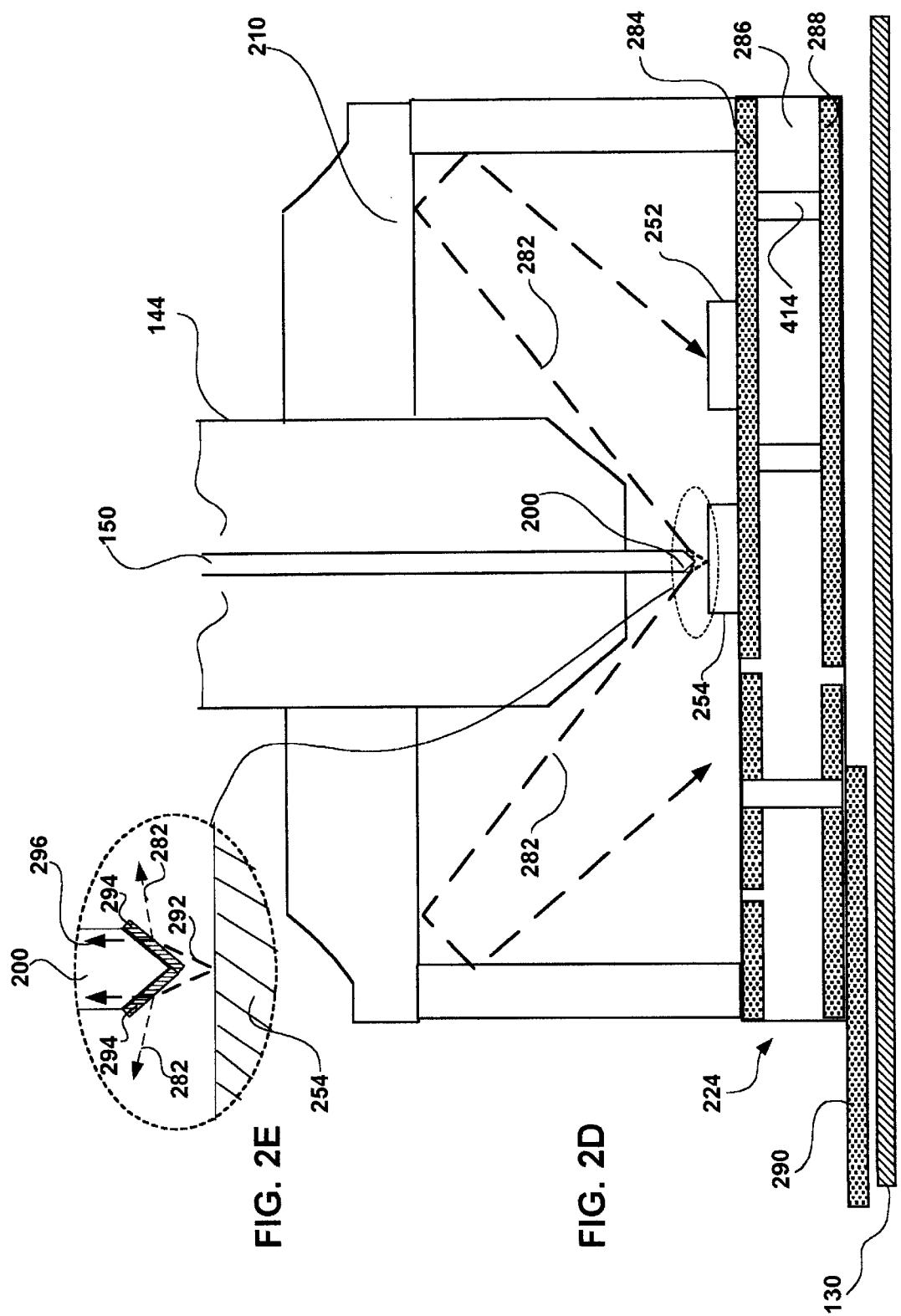

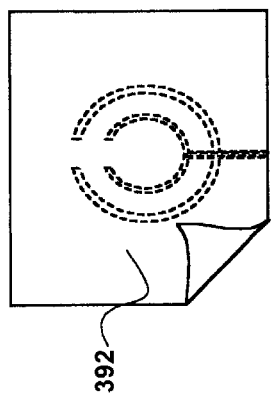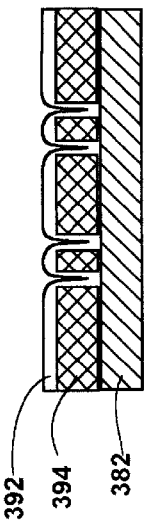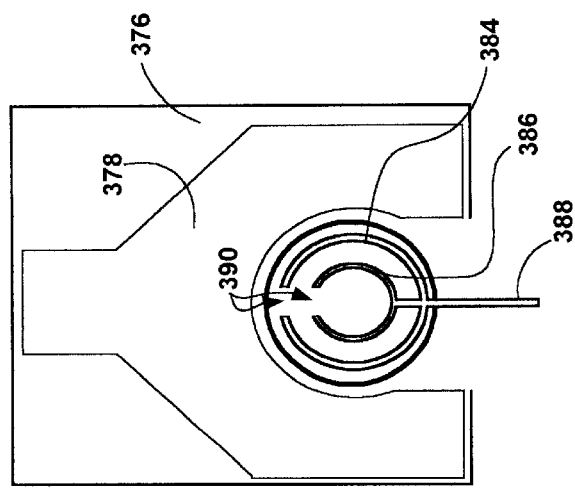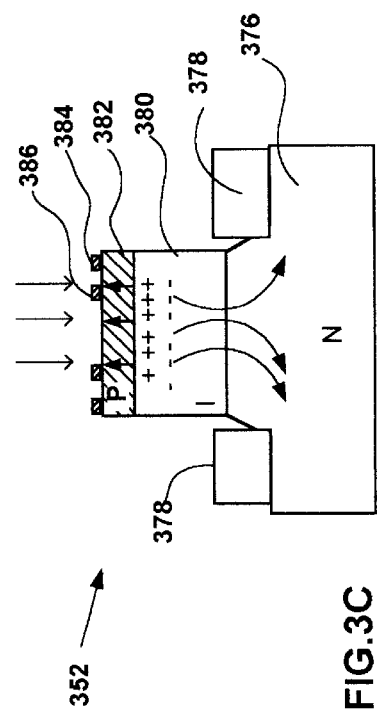

PINS

ASSEMBLY

METHOD & APPARATUS FOR PACKAGING HIGH FREQUENCY COMPONENTS

CROSS-REFERENCE TO RELATED APPLICATION

This application claims priority from Provisional Application Numbers: 60/171,933, entitled "Method for Automatic Power Control in Fiber-Coupled VCSEL Devices" filed on Dec. 22, 1999; 60/171,927, entitled "Double-Ring Contact for High-Speed Photo Diode" filed on Dec. 22, 1999; 60/174,038, entitled "Versatile Surface Mount Optoelectronic Package with High-Performance RF Interface" filed on Dec. 30, 1999. Each of the above-cited applications is incorporated herein by reference in its entirety.

This invention was made with Government support under Contract F30602-97-C-0144 awarded by the Air Force. The Government has certain rights in this invention.

BACKGROUND OF THE INVENTION

1. Field of the Invention

This invention generally relates to optical and electro-optical packing and more particularly to a package for high frequency components.

2. Description of the Related Art

The telecommunications network serving the United States and the rest of the world is presently evolving from analog to digital transmission with ever increasing bandwidth requirements. Fiber optic cable has proved to be a valuable tool, replacing copper cable in nearly every application from large trunks to subscriber distribution plants. Fiber optic cable is capable of carrying much more information than copper with lower attenuation.

The T-1 standards committee of ANSI has provided a draft document, "ANSI T1.105-1988", dated Mar. 10, 1988, which sets forth specifications for rate and format of signals that are to be used in optical interfaces. The provided specifications detail the Synchronous Optical Network (SONET) standard. SONET defines a hierarchy of multiplexing levels and standard protocols which allow efficient use of the wide bandwidth of fiber optic cable, while providing a means to merge lower level DS0 and DS1 signals into a common medium. In essence, SONET established a uniform standardization transmission and signaling scheme, which provided a synchronous transmission format that is compatible with all current and anticipated signal hierarchies. Because of the nature of fiber optics, expansion of bandwidth is easily accomplished.

Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. WDM is therefore the optical equivalent of frequency division multiplexing (FDM). Current implementations of WDM involve as many as 128 semiconductor lasers each lasing at a specific center frequency within the range of 1525–1575 nm. Each subscriber datastream is optically modulated onto the output beam of a corresponding semiconductor laser. The modulated information from each of the semiconductor lasers is combined onto a single optic fiber for transmission. As this digital signal is passed across a SONET network, it will be subject at various intervals to amplification by, for example, Erbium doped amplifiers and dispersion compensation by, for example, optical circulators with coupled Bragg filters.

At each node in the network, e.g. central office or remote terminal, optical transceivers mounted on fiber line cards are provided. On the transmit side, a framer permits SONET framing, pointer generation and scrambling for transmission of data from a bank of lasers and associated drivers, with each laser radiating at a different wavelength. On the receive side, the incoming signals are separated into channels detected by photodetectors, framed and decoded.

As more and more optical signal equipment (transmitting, receiving, amplification, coherence and switching) is being designed and utilized, a need has arisen for short and intermediate range optical links to allow high speed data transfers within various components of a central office. Currently such links require the same expensive circuits and lasers used in long-range optical links. What is needed is a short- and intermediate-range high data rate optical communication system that does not require the cost and complexity of prior art devices and which preferably can be achieved with a reduced form factor compared with prior art devices.

SUMMARY OF THE INVENTION

The present invention provides a method and apparatus for packaging high frequency electrical and/or electro-optical components. The present invention provides a package which may be surface mounted on a board with other electrical components. The shielding provided by the package minimizes electromagnetic interference with other electrical components on the board. The package includes a controlled impedance I/O interface for coupling with the electrical and/or electro-optical component(s) in the package. The package interface may also include a differential I/O capability to further control electromagnetic fields generated at the interface. Additionally, the package may include an optical link provided by one or more optical fibers extending from the package. These features allow the package to be used for a range of high-frequency components including optical transmitters and receivers. In combination these features result in a package that may be fabricated with relatively low cost and a reduced form factor when compared with prior art packages.

In an embodiment of the invention the package for high frequency components, includes a cover, a multilayer base and an electrical component. The cover includes a lower surface. The multilayer base includes a dielectric layer between a top layer and a bottom layer. The top layer and the bottom layer each include an electrically conductive ground plane portion, I/O pad portion, and differential I/O pad portion. Each corresponding portion is coupled to one another by vias within the dielectric layer. The multilayer base couples to the lower surface of the cover and the combined multilayer base and cover define an electrically shielded cavity within the package. The electrical component is located within the electrically shielded cavity. The electrical component is differentially coupled electrically though the differential I/O pad portion on the top layer to a corresponding differential pad portion on the bottom layer. RF energy radiated from the electrical component during operation is substantially contained within the package by the electrically shielded cavity.

In an alternate embodiment of the invention a method for fabricating a package for retaining an electrical component with a plurality of connection points is disclosed. The method for fabricating includes the acts of:

providing a dielectric substrate with a top surface and a bottom surface;

forming a conductive ground plane, pad, and differential pad portions on the top surface and the bottom surface of the dielectric substrate;

electrically coupling corresponding ones of the ground plane, pad, and differential pad portions on the top surface and the bottom surface of the dielectric substrate to provide controlled impedance external connections to the electrical component within the package;

bonding an electrically conductive cover to form an electrically shielded cavity around the electrical component.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 2D is a cross-sectional elevation showing details of the interior of the transmitter package.

FIG. 2E is an exploded cross-sectional view of the coupling between the semiconductor laser and the tip of the optic fiber.

FIG. 3C is a cross-sectional elevation showing details of the high speed photodetector in accordance with an embodiment of the current invention.

FIG. 3D is a top view of the high-speed photodetector shown in FIG. 3C.

FIG. 3E is a top view of the lift-off layer from which the upper twin concentric electrodes of the high-speed photodetector are defined.

FIG. 3F is a cross-sectional side view of the mask and lift-off layers from which the upper electrodes of the high-speed photodetector is formed.

DETAILED DESCRIPTION OF THE INVENTION

The present invention provides a novel package with radio frequency (RF) shielding for high speed electrical or opto-electronic elements. The package may be used for housing an optical transmitter and receiver combination for short and intermediate range information transfer at high data rates (1 Mhz–40 GHz). This allows the transmitter, receiver, or other opto-electronic components to be placed in close proximity with other electronic components without significant RF interference. The transmitter includes a control circuit to enhance the stability of output power levels, a modulator circuit with precise impedance matching for high frequency performance, and an optical coupling mechanism that reduces the effect of optical feedback between the laser and devices coupled to the fiber. These features allow the transmitter to deliver an optical output beam which can be modulated over a wide range of frequencies (1 Mhz–40 GHz), duty cycles and amplitudes with very precise definition of the rising and falling edges of the waveform. The receiver includes a high-speed photodetector designed to operate in the gigahertz range (1 Mhz–40 GHz) as well. The package may be fabricated with relatively low cost and a reduced form factor when compared with prior art electrical opto-electrical packages.

Figure 1:
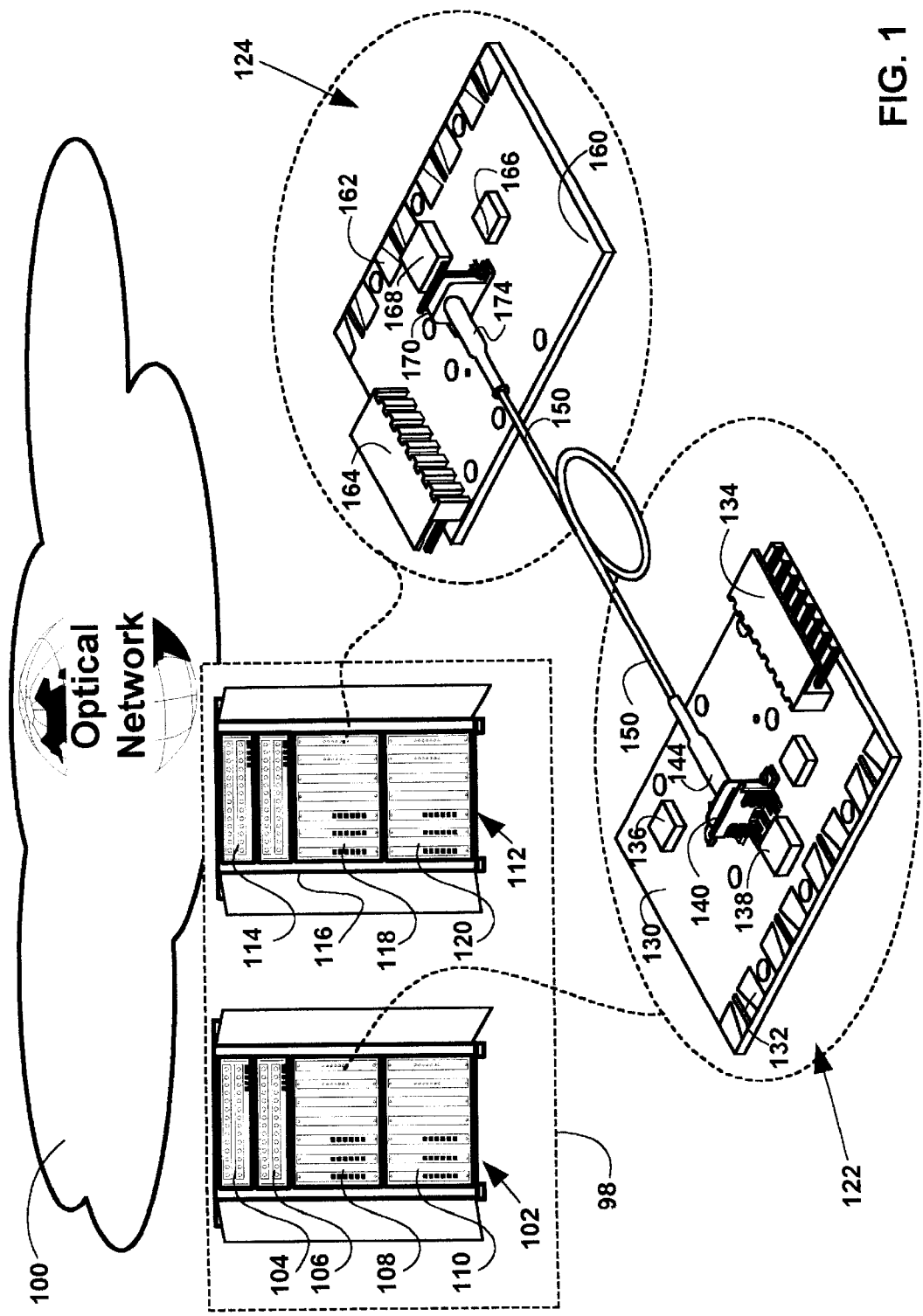
FIG. 1 shows a system diagram of an optical network including an embodiment of an optical transmitter and receiver in accordance with the current invention.

FIG. 1 shows an optical transmitter 140 and receiver 170 coupling various components which are part of an optical network 100. With the implementation of the Synchronous Optical Network (SONET), communication carriers throughout the world can interconnect their existing digital carrier and fiber optic systems. A central office/switching center 98 with a plurality of racks 102,112 are shown coupled to the optical network. Datastreams on the network are typically multiplexed using wavelength division multiplexing (WDM) in different portions of the optical spectrum. At the central office on racks 102 and 112, the line cards 108–110, 118–120 and multiplexer and demultiplexers 104–106, 114–116 respectively handle the transmission and reception of datastreams. Within a central office (CO), or in an embodiment of the invention between buildings of a CO, it will be advantageous to have inexpensive optical means for coupling various components which operate at high data rates e.g. 10 Gbit/s. Transmitter 140 is shown mounted on line card 122 at rack 102 while receiver 124 is shown mounted on a line card at rack 112. This transmitter and receiver can be utilized to provide short and intermediate range optical links between the equipment within the CO and specifically such components as optical multiplexers and demultiplexers, and routers. They are inexpensive to fabricate and have data transfer rates in the gigahertz range thus making them suitable for a broad range of applications. The use of an optical link between system components potentially avoids the problems associated with electrical coupling of such components, e.g. RF interference resulting from induction between the RF link (antenna or electrical cable) and other components in the system. A high frequency optical transmitter and receiver are shown that accomplishes this result.

Line card 122 may include a plurality of PC boards, including PC board 130. On PC board 130 are mounted a plurality of electronic components 136–138 and the optical transmitter 140. The PC board includes the interfaces 132–134 for bridging to adjacent boards or the backplane. In the embodiment shown component 138 includes a multiplexer for converting several low speed electrical signals from either of interfaces 132–134 to a single high speed signal which can be optically transmitted by transmitter 140. Through either of these interfaces the transmitter may be linked to a router, multiplexer, demultiplexer or other high speed electrical/optical component within CO 98. The optical transmitter 140 is coupled via a ferrule 144 to an optical fiber 150 which links the transmitter to the receiver 170. The receiver is shown mounted on a PC board 160. That PC board also includes electronic components 166–168, as well as interfaces 162–164. The PC board is shown as part of line card 124. In the embodiment shown component 168 includes a demultiplexer for converting the high speed serial data stream to multiple parallel lower bit rate electrical signals which can then be passed via either interface 162–164 directly or across the backplane to a router, multiplexer, demultiplexer, or other high speed electrical/ optical components.

Figure 2A:
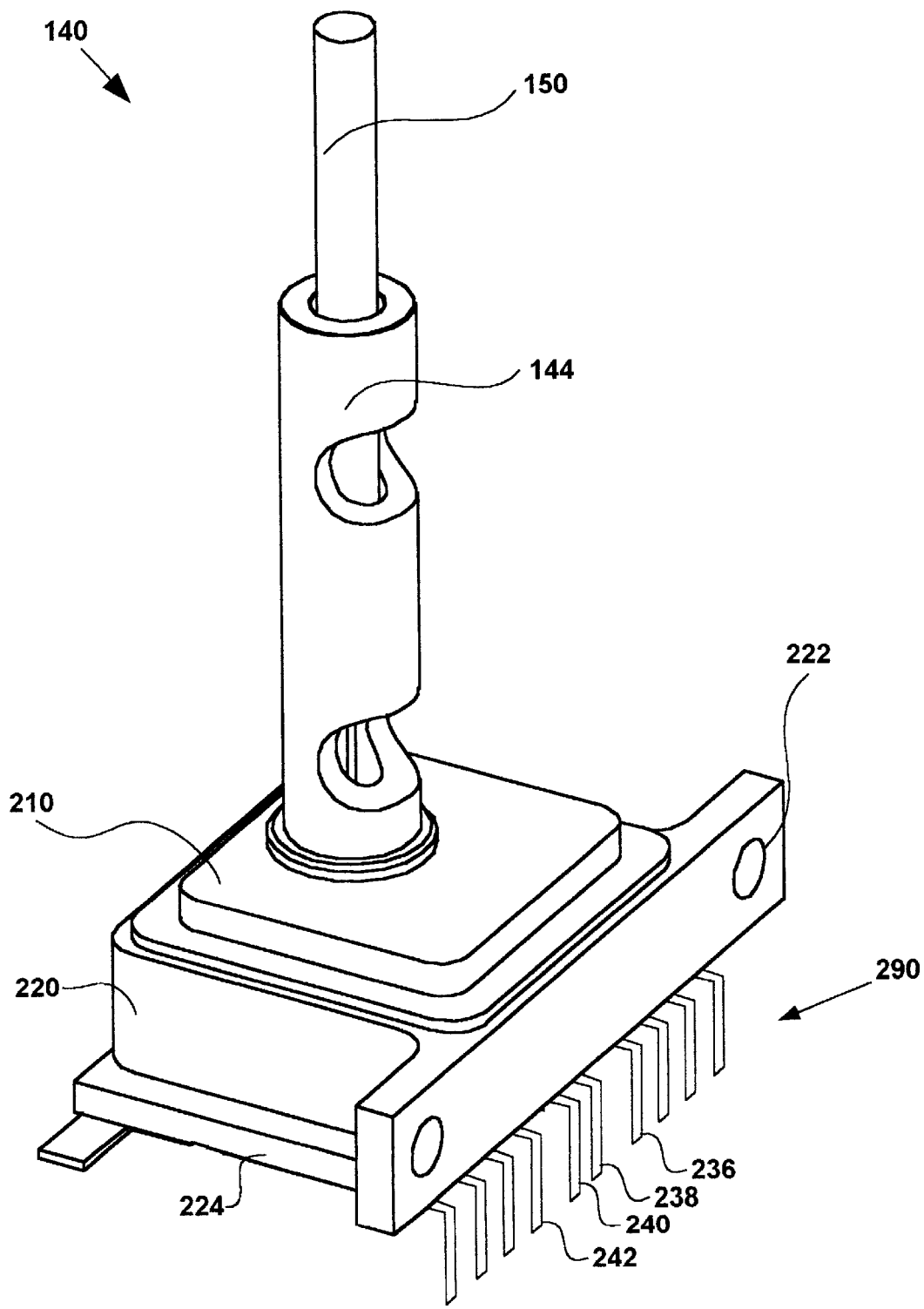
FIG. 2A shows an isometric side assembly view of the optical transmitter shown in FIG. 1.

FIG. 2A is an isometric side view of the transmitter package 140. The fiber optic 150, ferrule 144, lid 210, sidewall 220 and base 224 are shown. The sidewalls include base portion 222. The base includes pin connectors generally 290. Specific pins 236–242 are shown. Pins 236, 242 provide connection to a ground plane which is part of base 224 (see FIGS. 4A–E). Pins 238–240 provide negative and positive differential inputs respectively through the base to driver circuits (not shown) within the transmitter package. Fiber optic 150 is joined to the ferrule 144 using any one of a number of techniques well known to those skilled in the art including: soldering, sintering, compaction of glass frit, bonding with a suitable polymer, etc. In an embodiment of the invention, the various components of the transmitter package, e.g. ferrule 144, lid 210 and sidewalls 220 are fabricated from an electrically conductive material thus providing shielding of the RF circuitry within the transmitter package. In the embodiment of the invention shown in FIG. 2A the fiber and ferrule enter the package through the lid. In an alternate embodiment of the invention the fiber and ferrule may be introduced into the package through an opening defined in one of the sidewalls 220 or the base 224. In still another embodiment of the invention the ferrule is formed as an integral part of either the lid or the sidewall and the fiber is in turn joined with the ferrule.

Figure 2B:
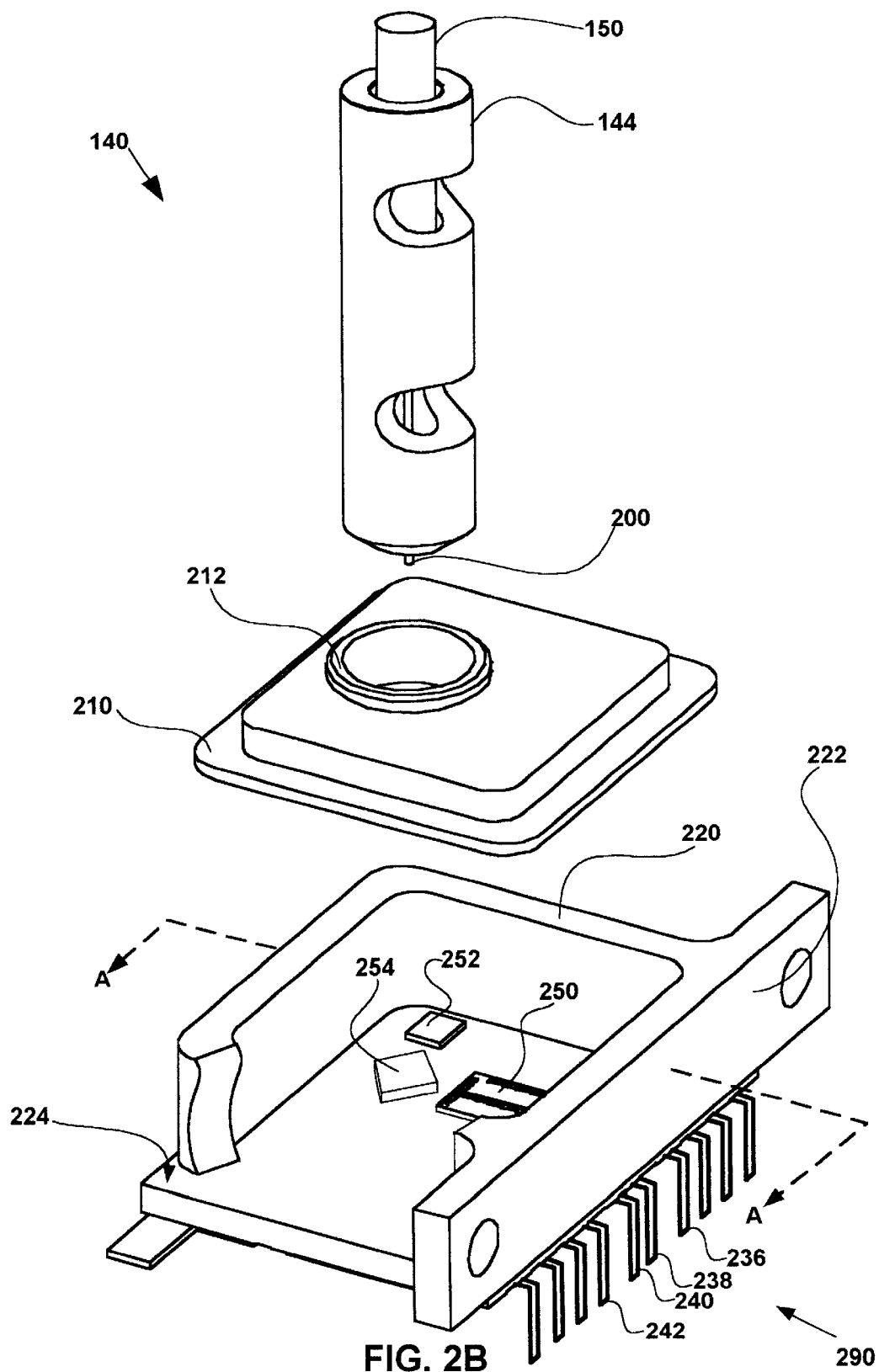
FIG. 2B shows an exploded side isometric assembly view of the optical transmitter shown in FIG. 2A.

FIG. 2B is an exploded isometric side view of the transmitter shown in FIG. 2A. The fiber tip 200 is shown protruding from the proximal end of the ferrule 144. The lid 210 defines within a rim portion 212 thereof, an opening through which the ferrule and fiber is inserted. The tip is positioned proximate a semiconductor laser positioned within the package (see FIGS. 2C–E). A gain medium, e.g. semiconductor laser 254, is mounted on the upper surface of base 224 along with other components such as monitor photodetector 252 and transmitter driver circuitry 250. In an embodiment of the invention the gain medium comprises a vertical cavity surface emitting laser (VCSEL). In an alternate embodiment of the invention the gain medium comprises a conventional slab laser diode which may mounted on a ceramic submount. In an alternate embodiment of the invention the gain medium comprises an external cavity diode laser (ECDL).

Figure 2C:
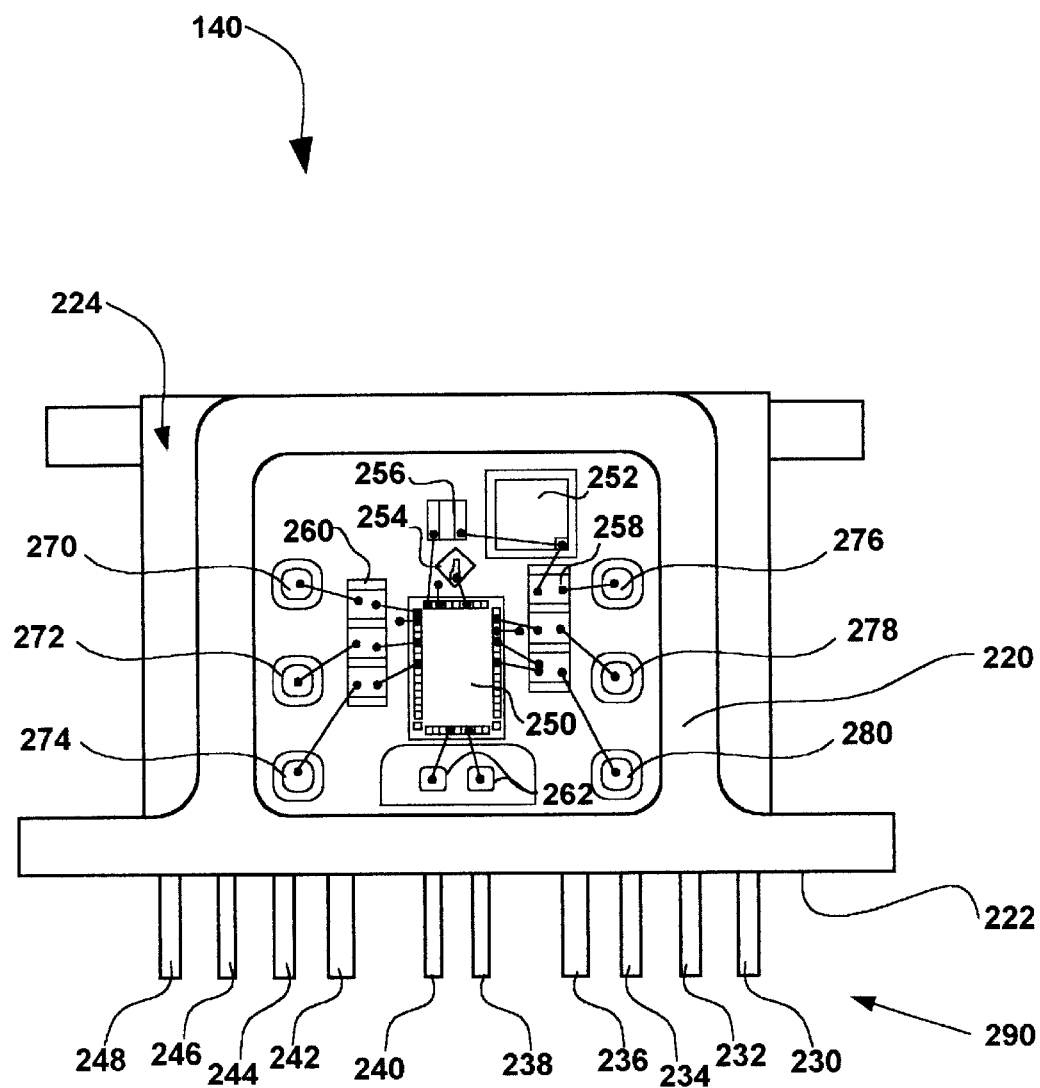
FIG. 2C shows a detailed top view of the component layout within the transmitter package shown in FIGS. 2AB.

FIG. 2C is a detailed layout of the components and connections associated with the transmitter and which are contained within sidewalls 220. Bar capacitors 258–260, transmitter driver 250, gain medium 254, resistor 256, and monitor photo detector 252 are shown. In addition to the ground plane pins 236,242 and the differential input pins 238–240 discussed above, pins 230–234 and pins 244–248 are shown. All pins provide input/output connections to components within the package. Pins 230–234, 244–248 each couple to a corresponding one of pads 270–280. Each of these pads in turn is electrically coupled via a corresponding capacitor on either of bar capacitors 258–260 to a corresponding input on one of the electrical components within the housing. Differential input pins 238–240 couples via differential pads 262 to the transmitter driver 250. The transmitter driver 250 provides drive and modulation current to the gain medium, e.g. laser 254, and accepts closed loop feedback via resistor 256 from monitor photo detector 252. In an embodiment of the invention shown in FIG. 5, the transmitter line driver includes a differential amplifier the inputs of which couple with the differential pads and the output of which couples to the gain medium. The ability to drive the laser with differential input signal avoids the prior art requirement for bully coaxial connections to shield a single drive signal delivered through the package to the transmitter. The electro magnetic (EM) fields generated by each of the differential signals injected onto the adjacent differential connections tend to cancel one another. By properly dimensioning the differential inputs a controlled impedance input with a limited amount of electromagnetic radiation can be designed.

FIGS. 2D–E are cross-sectional side elevation views of the interior of the package. Details of the optical coupling between the fiber optic 150 and the semiconductor laser 254 are shown. FIG. 2E provides a more detailed view of the coupling between the fiber tip 200 and the laser 254.

Ferrule 144 is inserted through an opening defined in the lid 210 to a location proximate to and within the output beam 292 formed by laser 254. The ferrule is then joined with the lid. Joining methods include soldering, brazing, welding, polymer adhesive, etc. The lid is also joined to the sidewalls utilizing one or more of the above mentioned joining methods. The ground plane portion of the base 224 is also joined to the sidewalls 220 utilizing one or more of the above mentioned joining methods. In an embodiment of the invention where each of the ferrule, lid, sidewalls, and ground plane include electrically conductive materials, an RF shield is thus constructed around the electrical components within the package.

The tip 200 is profiled to define a lens that collimates and/or collects the laser output 292 into output beam 296 within the fiber core 150. In an embodiment of the invention the lens includes at least one of: a convex lens, a conical lens, a parabolic lens, a hyperbolic lens, a ball lens, and a graded index of refraction lens (GRIN). In an embodiment of the invention the fiber optic is a multimode fiber. This fiber has an optically transmissive core that is substantially greater in diameter than a single mode fiber thus relaxing the alignment tolerances between the laser and fiber. In an alternate embodiment of the invention a single mode fiber is utilized with the result that alignment tolerances between the laser and fiber are more stringent. A partially reflective layer 294 is affixed to the tip of the fiber. The material from which this layer is fabricated may include: gold, silver, titanium, and a stack of several dielectric layers. This reflective layer has a number of advantages. First, it serves to decouple a portion of the energy from the laser to limit the energy intensity within the optical fiber to an acceptable range. Second, the partially reflective layer in combination with the geometry of the tip, which is generally aligned at an angle(s) to the laser output beam, reduces spurious reflections or feedback from either the fiber or tip to the laser. This improves the stability and definition of the output beam 292 generated by the laser. Thirdly, the reflective layer reflects a portion of the laser output beam 292 around the interior of the cavity, e.g. sidewalls, lid, and base, until it strikes the monitor photodetector 252. In an embodiment of the invention the interior surfaces of the cavity includes a highly reflective material such as gold or silver. This photo detector provides input to the closed loop feedback circuit (see FIG. 5) for controlling the output power of the gain medium, e.g. laser. The various components within the package cavity are coupled to the PC board via base 224, and pins 290. The base includes an electrically insulating layer 286 sandwiched between upper and lower electrically conductive patterned layers 284,288. Vias 414 connect the corresponding pad and ground plane patterns on the upper and lower electrically conductive patterned layers (See FIGS. 4A–E). This base serves an important role in the overall design of the package and the high frequency components it contains. The base design allows a controlled impedance input connection between the board 130 and the components. The base provides a ground plane which in combination with the sidewalls, lid and ferrule, creates an electrical shield around the RF components within the package. Prior art housings with substantially dielectric housings lack this shielding, and thus can not be placed in close proximity to other components on the board or an opening in the chassis, since to do so would result in unwanted RF coupling and interference.

Figure 3A:
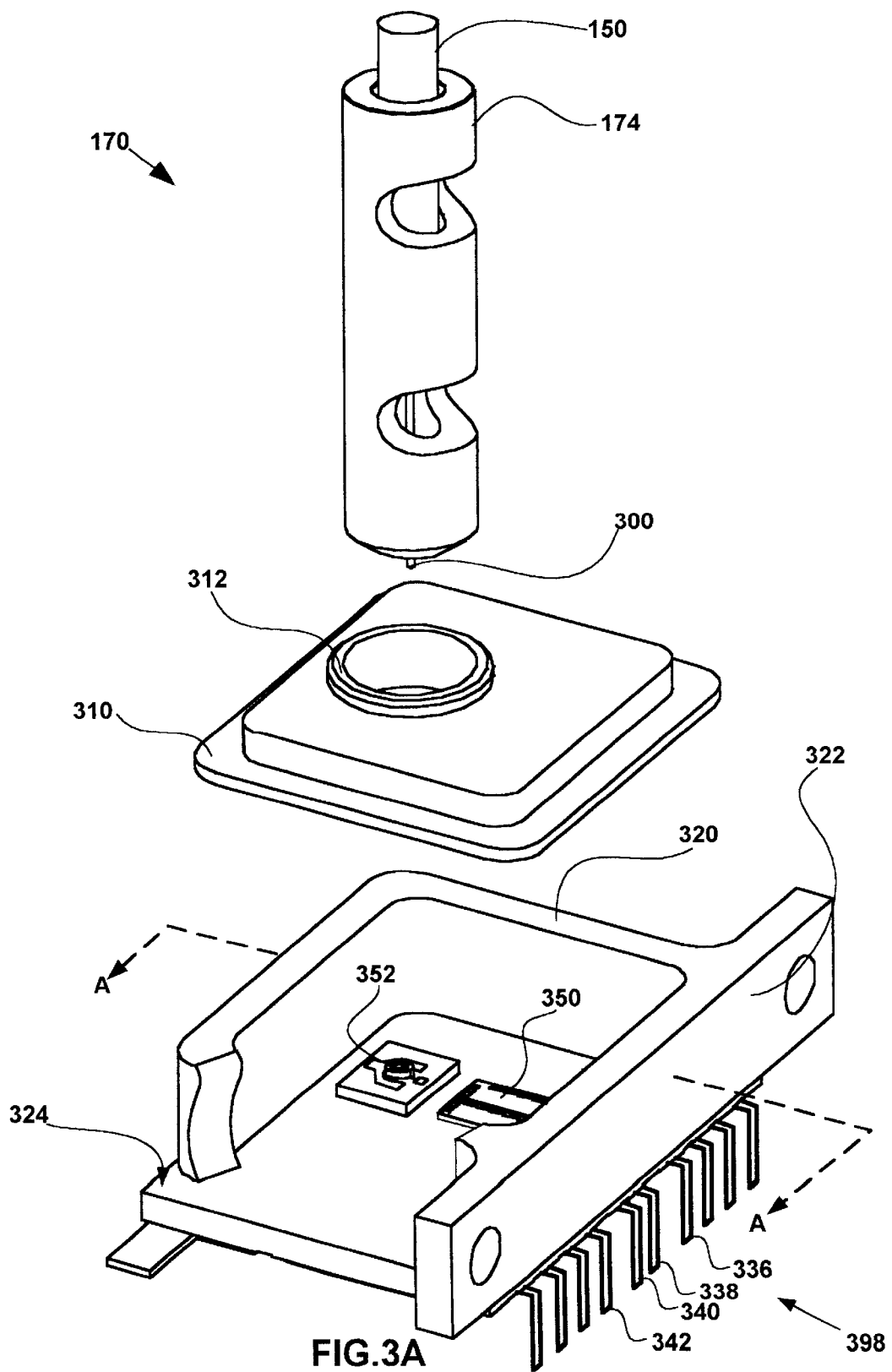
FIG. 3A shows an exploded side isometric assembly view of the optical receiver shown in FIG. 1.

FIG. 3A is an exploded isometric side view of the receiver package 170 shown in FIG. 1. With the exception of the components contained in the package 170 and the lack of a reflective coating on the tip 300 of the fiber optic 150, the package is substantially similar to that shown in FIG. 3A. The fiber tip 300 is shown protruding from the proximal end of the ferrule 174. The lid 310 defines within a rim portion 312 thereof, an opening through which the ferrule and fiber is inserted. The tip is positioned proximate a high speed photodetector 352 positioned within the package (see FIGS. 3B–F). The assembly of this package is similar in technique to that discussed above with respect to the transmitter with the ferrule, lid, sidewalls and base joined to one another to form an RF shield around the high frequency electrical and optical components within the package.

The high speed photodetector is mounted on the upper surface of base 324 along with other components such as a receiver amplifier circuitry 350. Pin connections 338–340 provide controlled impedance differential outputs for the signals received by the photodetector. Pins 336–342 provide connections to the ground plane.

Figure 3B:
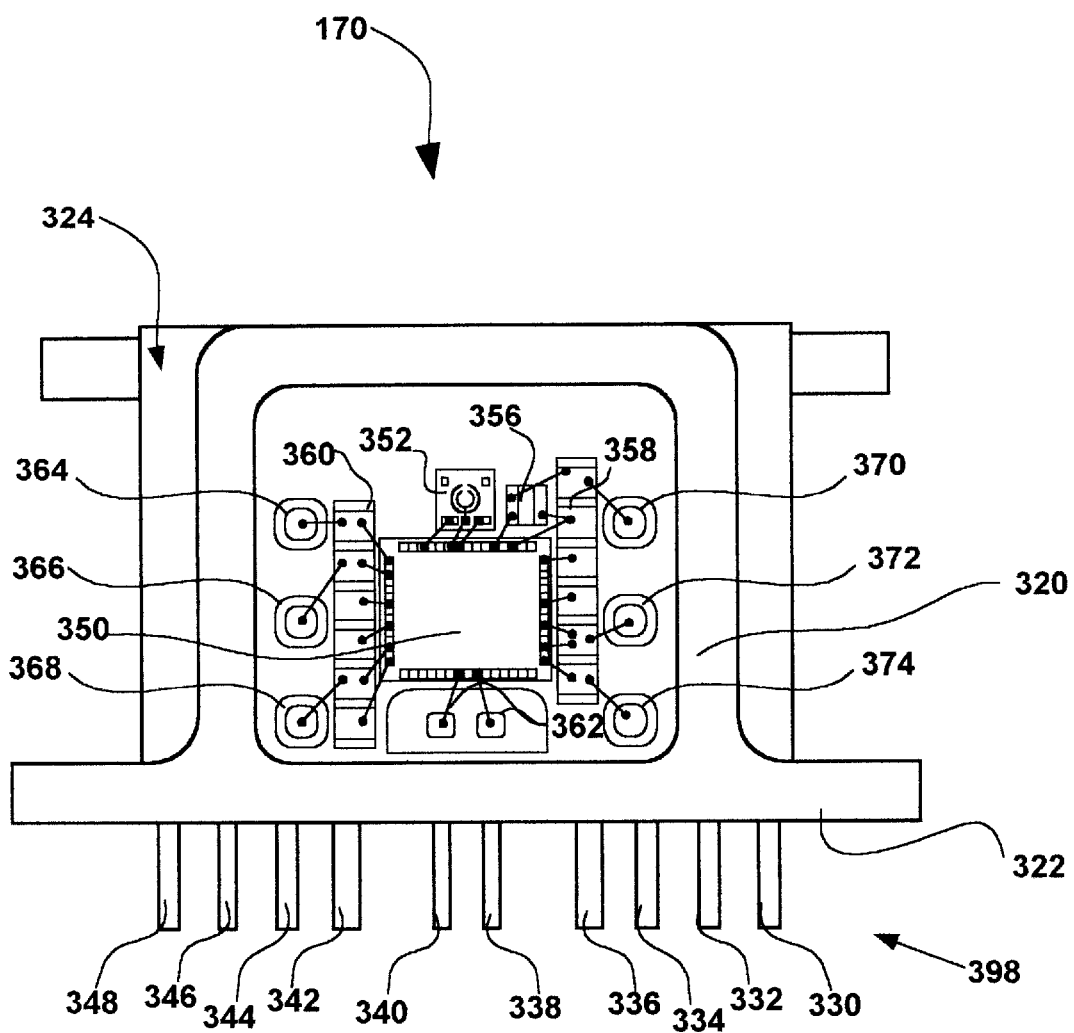
FIG. 3B shows a detailed top view of the component layout within the receiver package shown in FIG. 3A.

FIG. 3B is a detailed layout of the components and connections associated with the receiver and which are contained within sidewalls 320. Those components include bar capacitors 358–360, high speed photodiode 352, resistor 356, and receive circuitry 350. The base includes pin connectors generally 398. In addition to the ground plane pins 336,342 and the differential input pins 338–340 discussed above, pins 330–334 and pins 344–348 are shown. All pins provide connection to components within the package. Pins 330–334, 344–348 each couple to a corresponding one of pads 364–374. Each of these pads in turn is electrically coupled via a corresponding capacitor on either of bar capacitors 358–360 to a corresponding input/output on one of the electrical components within the housing. Differential input pins 338–340 couple via differential pads 362 to the receiver amplifier circuitry 350. This circuitry may provide filtering and pre-processing of the signals generated by the high speed photodetector responsive to incident radiation from the fiber optic 150.

Figure 6:
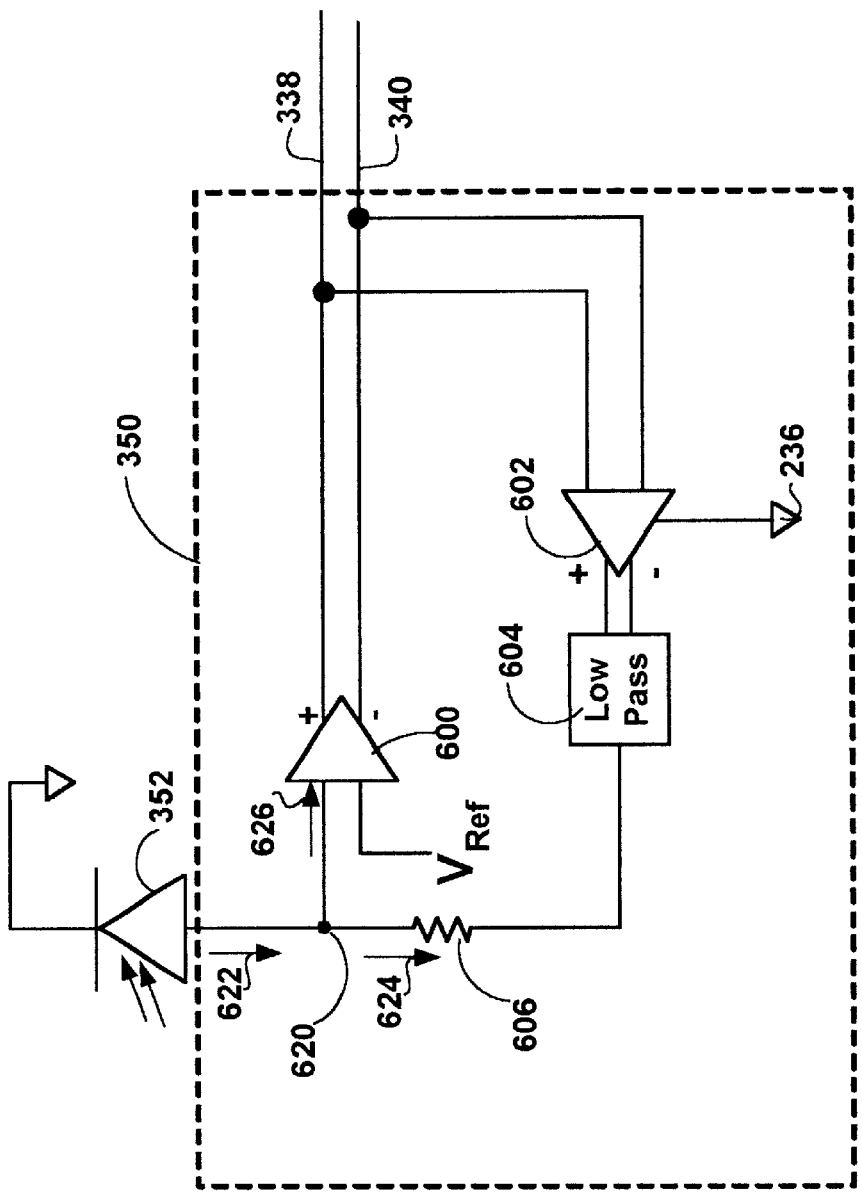
FIG. 6 is a circuit diagram of an embodiment of the receiver circuit shown in FIG. 3B.

In an embodiment of the invention shown in FIG. 6, the receiver amplifier circuitry 350 includes a differential amplifier the outputs of which couple with the differential pads and the input of which couples to the high speed photodetector. The ability to convert the output of the photodetector to a differential output signal within the package and to pass that differential signal via differential pads and pins to the outside world, avoids the prior art requirement for bulky coaxial connections to shield, and deliver with high fidelity, a single receiver signal from the package. The electromagnetic (EM) fields generated by each of the differential signals injected onto the adjacent differential connections tend to cancel one another. By properly dimensioning the differential outputs a controlled impedance output with a limited amount of electromagnetic radiation can be designed.

FIG. 3C–F shows greater details of the high speed photodetector 352. The detector is of a PIN type with a lower electrode 378 and a pair of concentric open rings 384–386 that form the top electrode. This detector has several advantages over prior art designs of either a metal semiconductor metal (SM) or a positive, intrinsic, negative implanted semiconductor (PIN) type. In contrast to an MSM type this design has a minimal electrode geometry in the path of the incident radiation, thus improving photodetector efficiency. In contrast to prior art PIN designs, which may define one perimeter ring electrode, this photodetector achieves a higher frequency response by means of a second ring concentric with the outer ring. Either or both of these rings may be opaque or partially transparent. The additional ring substantially reduces the resistance of the electrical contact to the P-type semiconductor layer, thus substantially reducing the electrical RC time constant of the photo detector. Additionally, both rings have a geometry that includes a gap to allow lift-off of the entire portion of the layer complementary to that of the electrodes in one step (See FIGS. 3E–F) This latter feature greatly simplifies fabrication of the device and improves yield, by reducing the uncertainties associated with the extra removal required by prior art designs of the disk formed within prior art ring electrodes.

FIGS. 3C–D are cross-sectional elevation and top views respectively of various details of the high speed photodetector 352. The various semiconductor layers, i.e. "n" doped layer 376, intrinsic layer 380, and "p" doped layer 382 are shown. The exterior upper broken-ring electrode 384 and the interior upper broken-ring electrode 386 are shown on the surface of the "p" doped layer. Electrical connection with these broken-rings is provided by an arm portion 388 of the upper electrode. Both rings are discontinuous being separated in the embodiment shown by a gap 390. The lower electrode 378 provides electrical contact with the "n" doped layer 376.

FIG. 3E is a top view of the lift-off layer from which the upper concentric broken ring electrodes are defined. FIG. 3F is a cross-sectional side view of the mask and lift-off layers from which the upper broken ring electrodes of the high speed photodetector are formed. The lift-off layer 392 from which the upper electrodes are formed may be fabricated from a range of electrically conductive materials, including gold and silver. Where conductivity and transparency is desired, the lift-off layer may be fabricated from a range of materials including: indium tin oxide. The mask layer 394 is used to define the lift-off. The gap 390 defined by the broken-rings allows portions of the lift-off layer between the broken rings and inside the interior ring to be lifted off as a single piece. This greatly reduces fabrication time, and improves yield by allowing a less aggressive lift-off process to be utilized.

Figure 4A:
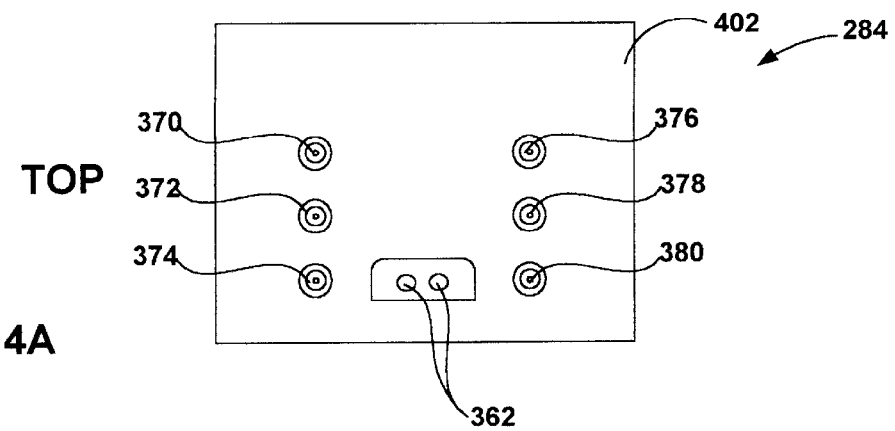
FIG. 4A is a detailed view of the upper conductive patterned layer of the package base for housing the transmitter, receiver, or other optical components.

FIGS. 4A–E provide detailed views of the multilayer base of the transmitter or receiver packages described above in connection with FIGS. 2–3. FIGS. 4A is a detailed view of the upper conductive patterned layer 402 of the package base for housing the transmitter, receiver, or other optical components. The upper layer includes a ground plane pattern 402, pads 370–380 and differential pads 362. Each pad is electrically isolated from the ground plane by a surrounding void or moat of nonplated area.

Figure 4B:
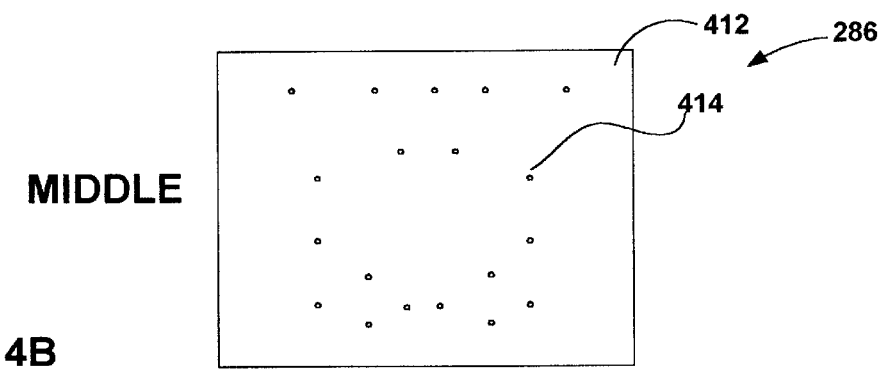
FIG. 4B is a detailed view of the intermediate dielectric layer of the package base.

FIG. 4B is a detailed view of the intermediate dielectric layer 412 of the package base. This layer includes a plurality of electrically conductive vias 414 for electrically coupling corresponding portions of the ground plane and pads of the upper patterned layer shown in FIG. 4A and the lower patterned layer shown in the following FIG. 4C.

Figure 4C:
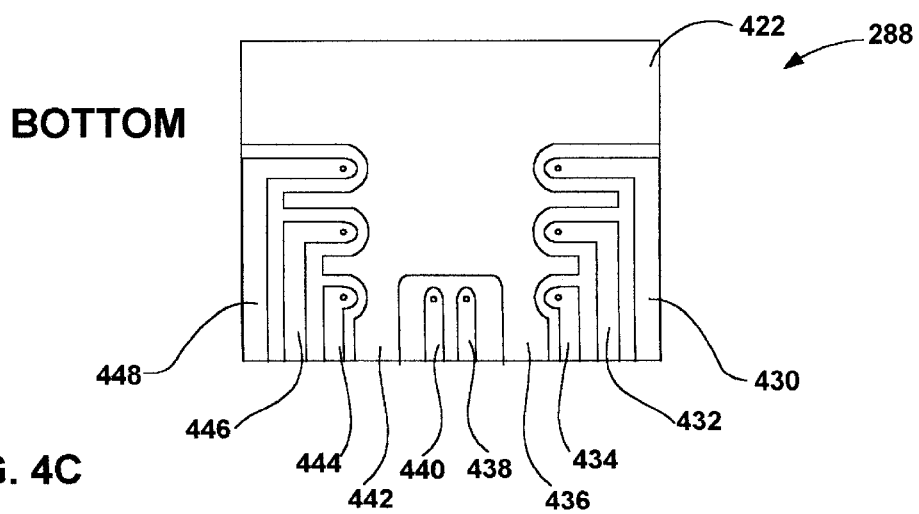
FIG. 4C is a detailed view of the lower conductive patterned layer of the package base.

FIG. 4C is a detailed view of the lower conductive patterned layer of the package base. This layer includes a ground plane pattern 422,436,442; pin pads 430–434, 444–448, and differential pin pads 438–440. Each pad is isolated from the ground plane by a surrounding void or moat of non-plated area that electrically isolates the pads from the ground plane. Vias in the dielectric layer couple the pin pads and differential pads on the lower layer to the pads and differential pads on the upper layer. Vias also couple various portions of the upper and lower ground planes.

Figure 4D:
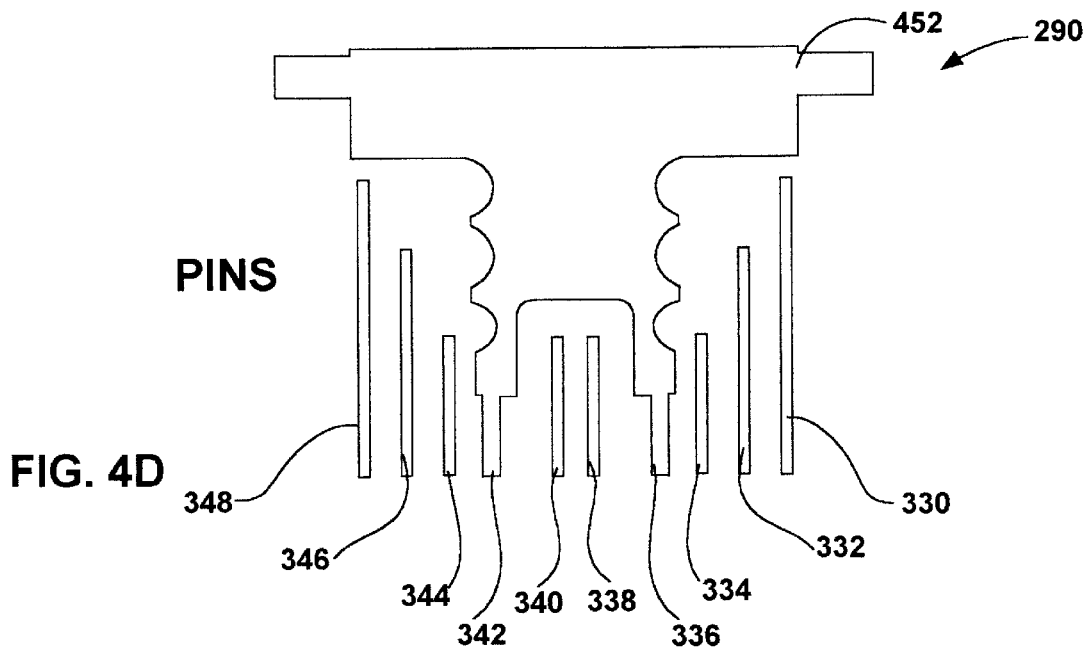
FIG. 4D is a detailed view of the pin and lead frame layer of the package base.

FIG. 4D is a detailed view of the pin and lead frame layer of the package base. This layer forms a protective covering on the lower layer and also provides pin connections with the lower layer. Each of pins 330–348 is electrically coupled to a corresponding one of the pin and differential pads 430–448 on the lower conductive patterned layer shown in FIG. 4C. Lead frame 452 covers the ground plane on the lower layer.

Figure 4E:
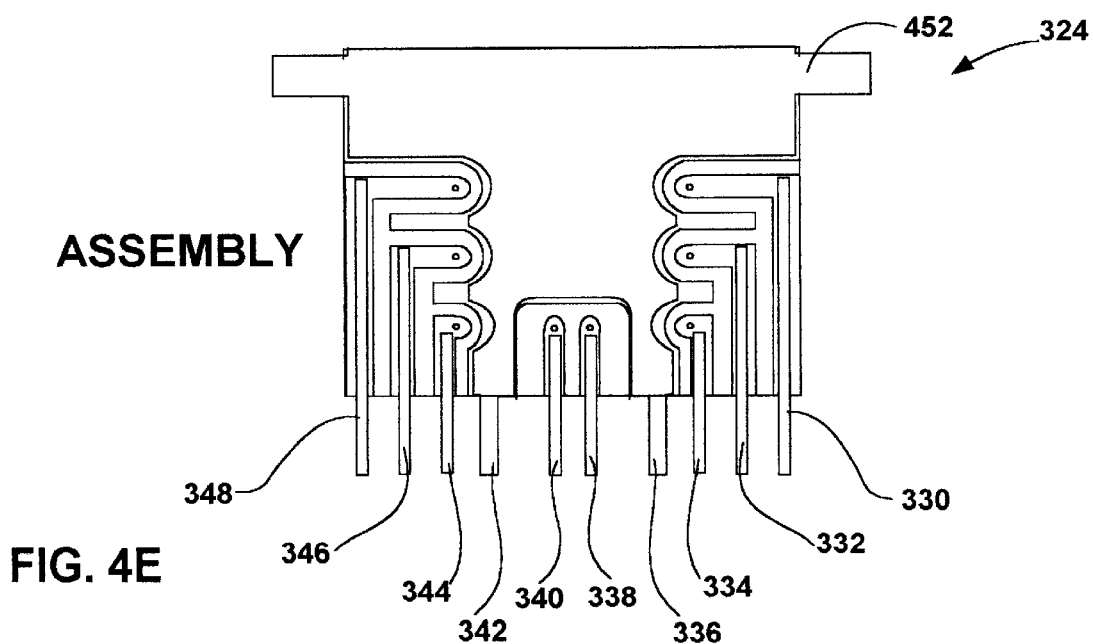
FIG. 4E is an assembly view of the combined layers shown in FIGS. 4A–D.

FIG. 4E is an assembly view of the combined layers shown in FIGS. 4A–D.

The receiver and transmitter have to this point been set forth as separately packaged. In an alternate embodiment of the invention those components can be housed in a single package, with an optical input and output provided by a single duplexed fiber optic connection to the outside world or by two fibers each operating in simplex mode, one coupled to the transmitter and one coupled with the receiver. In the latter embodiment the two fibers may be contained in one ferrule.

The package design set forth in FIGS. 3–4 has maintained the lid and sidewalls as distinct elements. In an alternate embodiment of the invention these components may be combined into a single cover piece. The cover may include an optical coupling such as an optical fiber(s). Alternately, the package may contain a high frequency electrical component with no optical interface.

Reference has been made with respect to both the receiver and the transmitter to a controlled impedance input/output. In an embodiment of the invention, impedance is chosen to match the transmission line characteristic impedance. If for example if the transmissions/reception line has a 50-ohm impedance then the differential path through the package should have the same impedance. In order to achieve this result, it is advantageous to use a 3-dimensional electromagnetic simulation package such as Ansoft HFSS™. Careful control of differential lead, trace and ground plane separation, geometries, and aspect ratios at each step along the input or output path is necessary in order to fix impedance at the desired value. Because the permitivity of the surrounding medium is changing along the input/output path, in many instances it will be the case that the above mentioned aspect ratios/parameters will be required to vary along the input/output path in order to obtain a fixed impedance. In an alternate embodiment of the invention controlled impedance may be achieved by implementing the above mentioned design considerations at discrete points along the input/output path eg: leads, trace, via, and pad.

Figure 5:
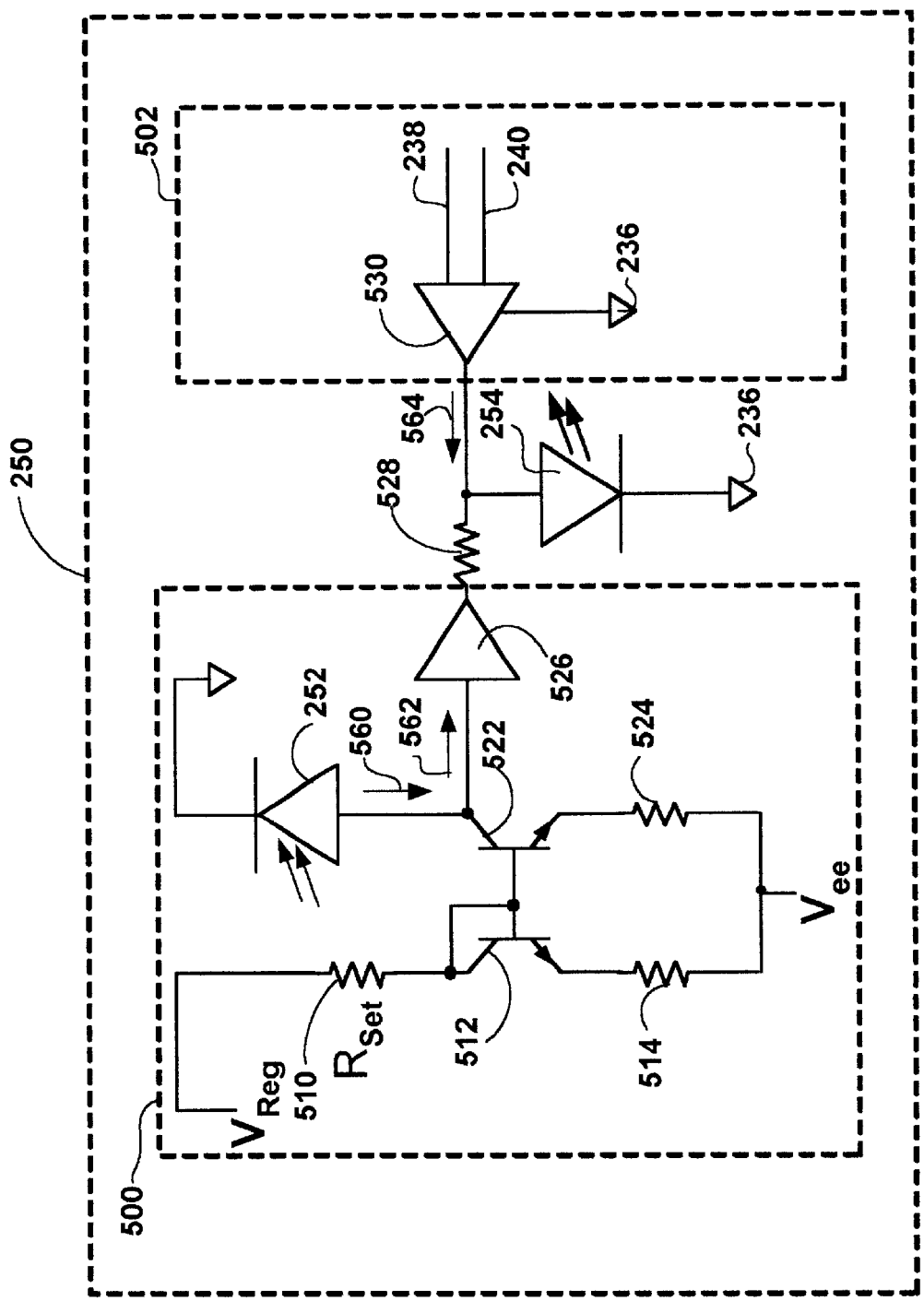
FIG. 5 is a circuit diagram of an embodiment of the transmitter driver shown in FIG. 2C.

FIG. 5 is a circuit diagram of an embodiment of the transmitter driver 250 shown in FIG. 2C. The driver includes a DC or carrier portion 500 and a modulator portion 502. The circuitry in the driver portion maintains a controlled DC power level for the semiconductor laser 254. The modulator provides the digital or analog modulation of the output beam. In the embodiment shown the carrier portion uses a novel control geometry which employs a current mirror to provide a fixed current to the output 522 to which both the monitor photodetector 252 as well as the semiconductor laser 254 are coupled. The current mirror is formed from the crosscoupled transistor pair 512–522. These transistors may be selected from a range of transistor types including but not limited to bipolar junction transistors and field effect transistors. The control gates/base of each transistor is coupled to that of the other. The input to both transistors is delivered from a source $V_{cc}$ through resistors 514, 524. The output of transistor 512 is coupled through a setpoint resistor 510 to an electrical sink with a voltage $V_{reg}$. The output of transistor 512 is also coupled to the control gate/base of both transistor 522 and 512. The output of transistor 522 is coupled to both the monitor photodiode as well as the semiconductor laser. The current to the laser 562, i.e. the drive signal, varies inversely with the current 560 drawn by the photodetector. Thus, as the photodetector draws more current from the output, indicating greater than desired laser output, less is made available to drive the semiconductor laser. As the photodetector draws less current from the output, indicating a less than desired laser output power, more is made available to the semiconductor laser. An amplifier 526 may be utilized to level shift the difference between the output current from the current mirror and the current drawn by the photodetector. This level shifted current then drives the gain medium, e.g. semiconductor laser, setting the DC power level of the emissions generated by the laser. To remove the effect of the high frequency modulation of the output beam on the DC driver circuit, either the monitor photodetector or the amplifier 526 may include a low pass filter. An isolation resistor 528 may be coupled between the output of the amplifier and the input to the semiconductor laser.

The modulator circuit 502 includes a differential amplifier 530. The differential amplifier has differential inputs 238–240 that accept as input an information signal expressed as the difference between the signals on inputs 238–240 and outputs an output signal 564 corresponding to the information signal. This output signal is modulated with the drive signal to insert the information signal on the output emissions from the gain medium, e.g. laser 254.

FIG. 6 is a circuit diagram of an embodiment of the receiver amplifier circuit 350 shown in FIG. 3B. That circuit converts the signal supplied by the high speed photodiode to a differential signal for output on differential signal lines 338–340. That circuit also removes any low-frequency component of the differential signal. This is accomplished by use of a closed loop feedback of the low frequency component of the differential output incorporating a low-pass filter. The receiver amplifier includes: differential amplifier(s) 600, feedback differential amplifier 602, low pass filter 604 and resistor 606. Each differential amplifier has both differential inputs and differential outputs. One input of differential amplifier 600 is coupled to a reference voltage. In the embodiment shown that voltage, $V_{ref}$, is a constant voltage, e.g. −0.8 volts. The other input of the differential amplifier 600 is coupled at node 620 to both the high speed photo detector 352 (See FIG. 3A–D) and via resistor 606 to the output of the low pass filter 604 which is part of the feedback circuit. The differential outputs of the differential amplifier 600 are coupled both to differential signal lines 338–340 and to either of the inputs to the feedback differential amplifier 602. One of the differential outputs of the feedback differential amplifier is coupled to the input of the low pass filter 604 In operation the feedback circuit constantly seeks to remove any low frequency component of the differential output of differential amplifier 600. It does this by drawing the DC level (i.e. low frequency component) of node 620 toward a match condition with that of the other differential input, i.e. $V_{ref}$. By contrast, any high frequency components of the photodetector signal (i.e. the data modulated on the optical signal) are not significantly affected by the feedback circuit since they are removed by the low pass filter 604. Thus the modulation on the differential outputs 338–340 corresponds with the data transmitted. This is passed via differential pins 338–340 (See FIG. 3A–B) to processors, routers and/or demultiplexers for further processing. In an alternate embodiment of the invention there may be multiple stages of differential amplifiers with gain control coupled to the output of differential amplifier 600 to add further gain to the differential data signal.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A package for high frequency components, comprising:
   a cover with a lower surface;
   a multilayer base including a dielectric layer between a top layer and a bottom layer, and the top layer and the bottom layer each including an electrically conductive ground plane portion, I/O pad portion, and differential I/O pad portion, with each of the corresponding portions coupled to one another by vias within said dielectric layer, and the multilayer base coupled to the lower surface of the cover and the combined multilayer base, and cover defining an electrically shielded cavity within the package; and
   an electrical component located within the electrically shielded cavity and the electrical component differentially coupled electrically through the differential I/O pad portion on the top layer to corresponding differential pad portion on the bottom layer and an RF energy radiated from said electrical component during operation substantially contained within the package by the electrically shielded cavity.

2. The package of claim 1, wherein said cover further comprises:
   a lid; and
   sidewalls with an upper surface and a lower surface, and the upper surface coupled with the lid and the lower surface coupled to said electrical component.

3. The package for high frequency components of claim 1, further comprising:
   a geometry between said differential I/O pad portions on the top layer and differential I/O pad portions on the bottom layer which together with a thickness of the dielectric layer defines a differential interface of a known impedance between at least one of an external signal source and an external signal sink together with said electrical component.

4. The package for high frequency components of claim 1, wherein further each of said cover and said multilayer base includes electrically conductive portions which substantially surround said cavity to provide a shield to the RF energy radiated from said electrical component during operation.

5. The package for high frequency components of claim 4, wherein the ground plane portion of said top layer electrically and physically couples with the lower surface of said sidewalls to provide a shield to the RF energy radiated from said electrical component during operation.

6. The package for high frequency components of claim 1, further comprising:
   a plurality of electrical contacts electrically coupled to each of said ground plane portion, I/O pad portion, and differential I/O pad portions of the bottom layer of said multilayer base.

7. The package for high frequency components of claim 6, wherein said plurality of electrical contacts include at least one of:
   pin contacts, ball grid array contacts and wire bond contacts.

8. The package for high frequency components of claim 1, further comprising:
   an optical fiber extending from a location external to said package to a location within the cavity through an opening defined in one of said cover and said multilayer base.

9. The package for high frequency components of claim 8, further comprising:
   an optical transmitter for generating an emission along a path, and the optical transmitter located within said electrically shielded cavity and electrically coupled to said differential I/O pad portion to accept differential drive signals from an external source; and
   the optical fiber with a tip portion located in the path to optically couple with the emission.

10. The package for high frequency components of claim 9, further comprising:
    a reflector on the tip portion of the optical fiber to limit an optical coupling efficiency of said optical transmitter with said optical fiber.

11. The package for high frequency components of claim 9, wherein the tip portion of said optical fiber further defines an optical lens for collimating the emission along said optical fiber.

12. The package for high frequency components of claim 9, further comprising:
    a differential driver with a positive input, a negative input and an output and the output coupled to the optical transmitter, and the positive input and the negative input coupled to the differential I/O pad portion of the top layer of said multilayer base, and said differential driver responsive to a differential information signal coupled the differential I/O pad portion on the bottom layer of said multilayer base to vary a level of the emissions of the optical transmitter to correspond with said differential information signal.

13. The package for high frequency components of claim 8, further comprising:
    a photo detector defined on a multilayer semiconductor structure, and the photodetector located within said cavity to detect emissions from said optic fiber, and the photodetector including:

a) a first electrode formed by at least two substantially concentric conductive rings electrically coupled to one another and to a portion of a first surface of the multilayer semiconductor structure; and b) a second electrode coupled to a second surface of the multilayer semiconductor structure, and said first and said second electrodes coupled to the differential I/O pad portion of the upper layer of said multilayer base for the transfer of a current generated by the photo detector responsive to the emissions from said optic fiber.

14. The package for high frequency components of claim 13, wherein each of the at least two substantially concentric conductive rings of said first electrode defines a gap in a corresponding circumference thereof to facilitate fabrication of the first electrode.

15. The package for high frequency components of claim 13, wherein said first electrode comprises at least one of: gold, silver and indium tin oxide.

16. The package for high frequency components of claim 13, wherein said photo detector comprises a PIN type.

17. The package for high frequency components of claim 8, further comprising:

a plurality of electrical contacts extending from the bottom layer of said multilayer base substantially parallel with a longitudinal axis of said optical fiber to allow side mounting of the microwave package.

18. A method for fabricating a package for retaining an electrical component with a plurality of connection points, and the method for fabricating comprises the acts of:

providing a dielectric substrate with a top surface and a bottom surface;

forming a conductive ground plane, pad, and differential pad portions on the top surface and the bottom surface of the dielectric substrate;

electrically coupling corresponding ones of the ground plane, pad, and differential pad portions on the top surface and the bottom surface of the dielectric substrate to provide controlled impedance external differential connections to the electrical component within the package;

bonding an electrically conductive cover to form an electrically shielded cavity around the electrical component.

19. The method for fabricating a package for retaining an electrical component of claim 18, further comprising the act of:

optically coupling with the electrical component through one of the cover and the dielectric substrate.

20. A package comprising:

an electrically conductive cover;

a base coupled to the electrically conductive cover, wherein the base includes an electrically insulating layer coupled between two electrically conductive patterned layers, wherein a first one of the two electrically conductive patterned layers includes one or more pairs of differential pads, wherein each pair of differential pads is configured to convey a pair of differential signals, wherein a second one of the two layers includes a plurality of electrical contacts, wherein a first portion of the electrical contacts are each connected to a respective one of the differential pads by a via extending through the electrically insulating layer; and an electrical component electrically coupled to a first pair of differential pads;

wherein the base and the electrically conductive cover form an enclosure around the electrical component.

21. The package of claim 20, wherein the electrically conductive cover includes electrically conductive sidewalls, wherein the electrically conductive sidewalls are coupled to the base.

22. The package of claim 20, wherein each of the two electrically conductive patterned layers includes a ground plane portion, wherein the ground plane portions are coupled by one or more vias extending through the electrically insulating layer.

23. The package of claim 20, further comprising a ferrule extending through the cover, wherein the ferrule is configured to introduce an end of an optical fiber into the package.

24. The package of claim 20, wherein the electrical component is configured to convert an output signal from an optical receiver to a first pair of differential signals and to provide the first pair of differential signals to the first pair of the differential pads.

25. The package of claim 20, wherein the electrical component comprises a driver circuit configured to receive a first pair of the differential signals from the first pair of differential pads, wherein the driver circuit is configured to generate a driver signal for an optical transmitter in response to the first pair of differential signals.

26. A package conductive cover means;

base means including an electrically insulating means coupled between two electrically conductive patterned layers, wherein a first of the two electrically conductive patterned layers includes one or more pairs of differential pads, wherein each pair of differential pads conveys a pair of differential signals, wherein a second of the two layers includes a plurality of electrical contacts, wherein a first portion of the electrical contacts are each coupled to a respective one of the differential pads by a via extending through the electrically insulating means;

an electrical component electrically coupled to a first pair of differential pads;

wherein the electrically conductive cover means and the base means are coupled to form an enclosure for the electrical component.

* * * * *

UNITED STATES PATENT AND TRADEMARK OFFICE
CERTIFICATE OF CORRECTION

PATENT NO. : 6,632,029 B1
DATED : October 14, 2003
INVENTOR(S) : Robert S. Williamson, III and Robert A. Marsland It is certified that error appears in the above-identified patent and that said Letters Patent is hereby corrected as shown below:

<u>Column 14,</u>
Line 38, please change "A package, conductive cover means;" to
-- A package comprising:
    electrically conductive cover means; --

Signed and Sealed this

Second Day of March, 2004

JON W. DUDAS
*Acting Director of the United States Patent and Trademark Office*